(12) United States Patent
Rueger et al.

(10) Patent No.: US 7,056,833 B2
(45) Date of Patent: Jun. 6, 2006

(54) METHODS OF FILLING GAPS AND METHODS OF DEPOSITING MATERIALS USING HIGH DENSITY PLASMA CHEMICAL VAPOR DEPOSITION

(75) Inventors: Neal R. Rueger, Boise, ID (US); William Budge, Homedale, ID (US); Weimin Li, Shanghai (CN); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 111 days.

(21) Appl. No.: 10/669,671

(22) Filed: Sep. 23, 2003

(65) Prior Publication Data

US 2005/0064729 A1 Mar. 24, 2005

(51) Int. Cl.
*H01L 21/31* (2006.01)
(52) U.S. Cl. ...................... 438/758; 438/759
(58) Field of Classification Search ............... 438/758, 438/759, 762, 770, 778, 786, 787, 788
See application file for complete search history.

(56) References Cited

U.S. PATENT DOCUMENTS

| | | | |
|---|---|---|---|
| 5,872,058 A | 2/1999 | Van Cleemput et al. | |
| 5,972,765 A | 10/1999 | Clark et al. | |
| 6,025,280 A | 2/2000 | Brady et al. | |
| 6,030,881 A | 2/2000 | Papasouliotis et al. | |
| 6,077,791 A | 6/2000 | DeTar | |
| 6,255,197 B1 * | 7/2001 | Fujimura et al. | 438/475 |
| 6,331,494 B1 | 12/2001 | Olson et al. | |
| 6,368,988 B1 | 4/2002 | Li et al. | |
| 6,395,150 B1 | 5/2002 | Van Cleemput et al. | |
| 6,436,195 B1 | 8/2002 | Smythe et al. | |
| 6,614,977 B1 * | 9/2003 | Johnson et al. | 385/129 |
| 6,670,241 B1 | 12/2003 | Kamal et al. | |
| 6,771,868 B1 | 8/2004 | Johnson et al. | |
| 2003/0012538 A1 | 1/2003 | Johnson et al. | |

FOREIGN PATENT DOCUMENTS

JP 10200115 A * 7/1998

OTHER PUBLICATIONS

Nguyen S V: "High-Density Plasma Chemical Vapor Deposition of Silicon-Based Dielectric Films for Integrated Circuits" IBM Journal of Research and Development, IBM Corporation, Armonk, US, vol. 43, No. 1/2, Jan. 1999, pp. 109-126.

* cited by examiner

*Primary Examiner*—Brook Kebede
(74) *Attorney, Agent, or Firm*—Wells St. John P.S.

(57) ABSTRACT

The invention includes a method of filling gaps in a semiconductor substrate. A substrate and a gas mixture containing at least one heavy-hydrogen compound are provided within a reaction chamber. The gas mixture is reacted to form a layer of material over the substrate by simultaneous deposition and etch of the layer. The layer of material fills the gap such that the material within the gap is essentially void-free. The invention includes a method of providing improved deposition rate uniformity. A material is deposited over a surface in the presence of at least one gas selected from the group consisting of $D_2$, HD, DT, $T_2$ and TH. The net deposition rate during the deposition has a degree of variance across the surface which is measurably improved relative to a corresponding degree of variance that occurs during deposition utilizing $H_2$ under otherwise substantially identical conditions.

7 Claims, 4 Drawing Sheets

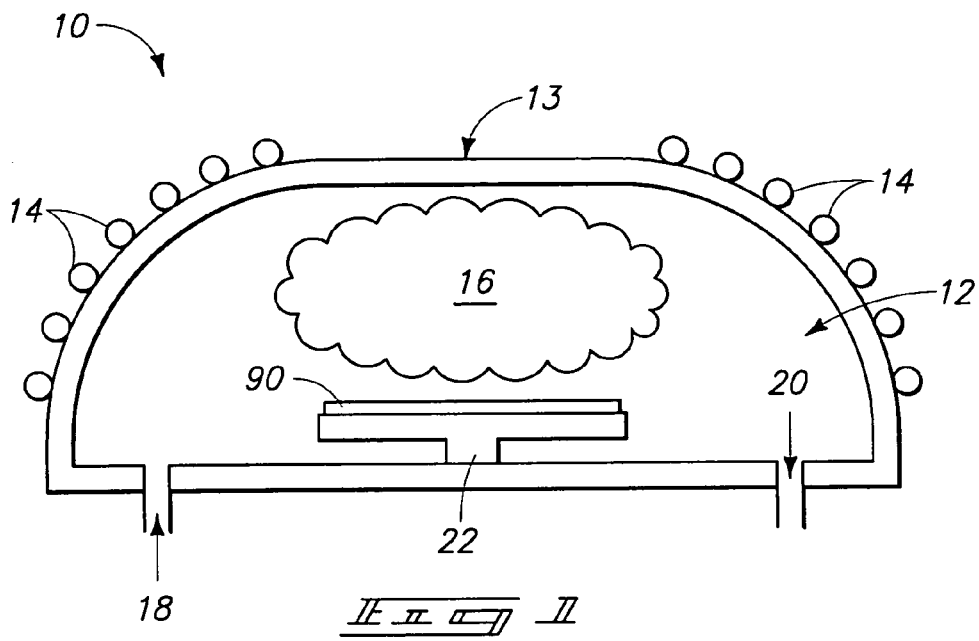
_Fig. 1_
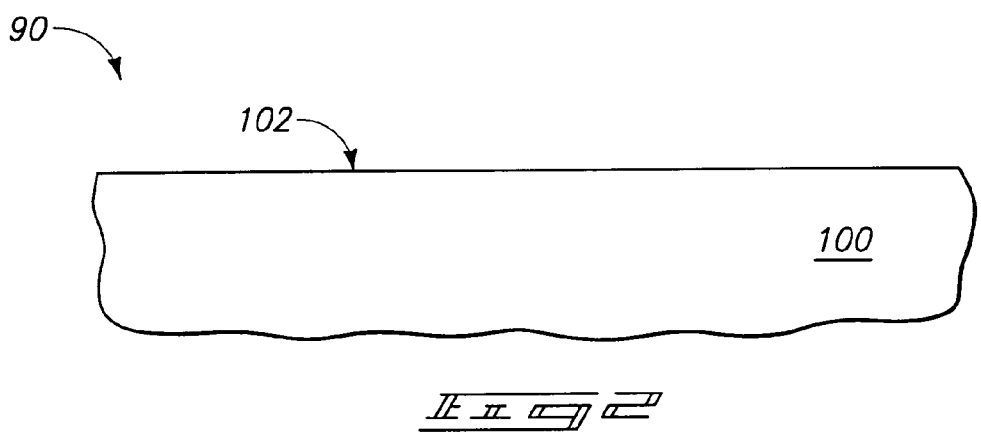
_Fig. 2_
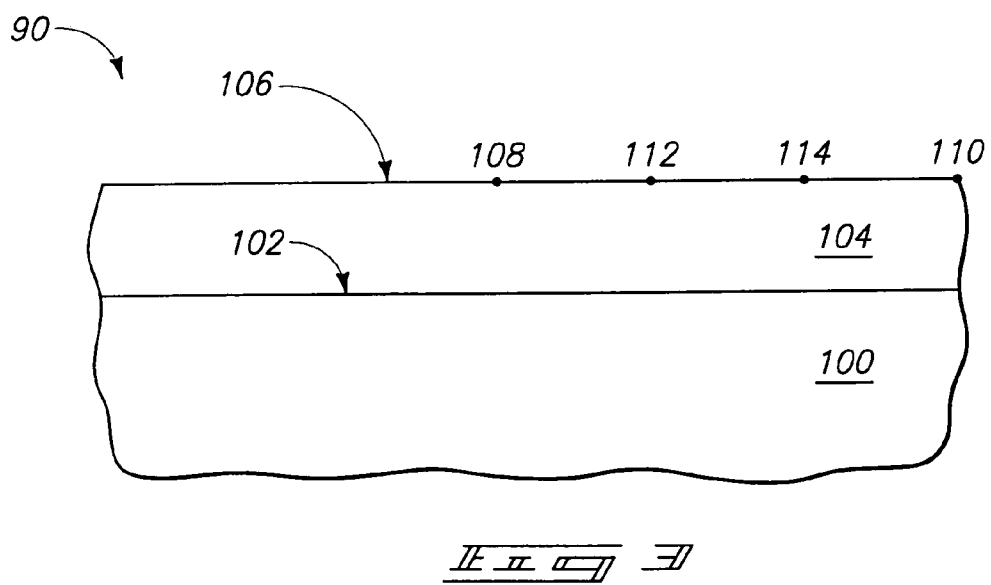
_Fig. 3_

METHODS OF FILLING GAPS AND METHODS OF DEPOSITING MATERIALS USING HIGH DENSITY PLASMA CHEMICAL VAPOR DEPOSITION

TECHNICAL FIELD

The invention pertains to methods of forming a layer over a substrate, and in particular embodiments pertains to methods of filling a gap.

BACKGROUND OF THE INVENTION

Insulative materials and layers of insulative materials are used extensively in various semiconductor applications to insulate or electrically isolate structural features and circuit elements. The insulative properties of such materials and layers can often be affected by the ability to minimize or exclude void areas formed during the deposition of the insulative material. Uniformity of deposition rates across a deposited layer during deposition can influence film quality and ability to effectively minimize void inclusion. As feature size of devices decreases, widths of gaps to be filled also decreases and aspect ratio of such gaps can become very high. Accordingly, minimization of void area within gap-fill becomes more difficult but increasingly important for effective isolation. The variance in deposition rate across a surface can make optimizing deposition conditions and parameters for void exclusion difficult if not impossible.

One method that has been utilized to address the need for precision gap-fill is high density plasma chemical vapor deposition (HDP-CVD). Further improvements over other conventional methods have been conferred by replacing sputtering gases such as argon conventionally utilized in HDP-CVD systems, with an alternative sputtering gas such as $H_2$. The replacement with $H_2$ has allowed reduced occurrence of voids in gap-fill applications under certain deposition conditions.

It is desirable to develop improved gap-fill techniques and methods for providing improved deposition rate uniformity.

SUMMARY OF THE INVENTION

In one aspect, the invention encompasses a method of depositing a layer over a substrate. A substrate is provided within a high density plasma reaction chamber. At least one compound having a heavy-hydrogen isotope substituent is provided into the reaction chamber and a high density plasma is generated within the chamber. A layer incorporating at least a portion of the heavy-hydrogen compound is chemical vapor deposited over the substrate.

In one aspect the invention encompasses a method of filling gaps in a semiconductor substrate. A substrate is provided within a reaction chamber and a gas mixture is provided within the reaction chamber. The gas mixture contains at least one heavy-hydrogen containing compound. The gas mixture is reacted to form a layer of material over the substrate by simultaneous deposition and etch of the layer. The layer of material fills the gap such that the material within the gap is essentially void-free.

In one aspect, the invention encompasses a method of providing an improved deposition rate uniformity. A material is deposited over a surface in the presence of at least one gas selected from the group consisting of $D_2$, HD, DT; $T_2$ and TH. An overall deposition rate during the depositing is defined by a ratio of deposition of the material relative to a simultaneous rate of etch of the material. The overall deposition rate has a degree of variance across the surface which is measurably improved relative to a corresponding degree of variance that occurs during deposition utilizing $H_2$ under otherwise substantially identical conditions.

BRIEF DESCRIPTION OF THE DRAWINGS

Preferred embodiments of the invention are described below with reference to the following accompanying drawings.

FIG. 1 is a diagrammatic cross-sectional view of a reactor that can be utilized for performing methods of the present invention.

FIG. 2 is a diagrammatic cross-sectional view of a semiconductor substrate wafer at a preliminary step of a method of the present invention.

FIG. 3 is a view of the FIG. 2 substrate wafer shown at a processing step subsequent to that of FIG. 2.

DETAILED DESCRIPTION OF THE PREFERRED EMBODIMENTS

Figure 4:
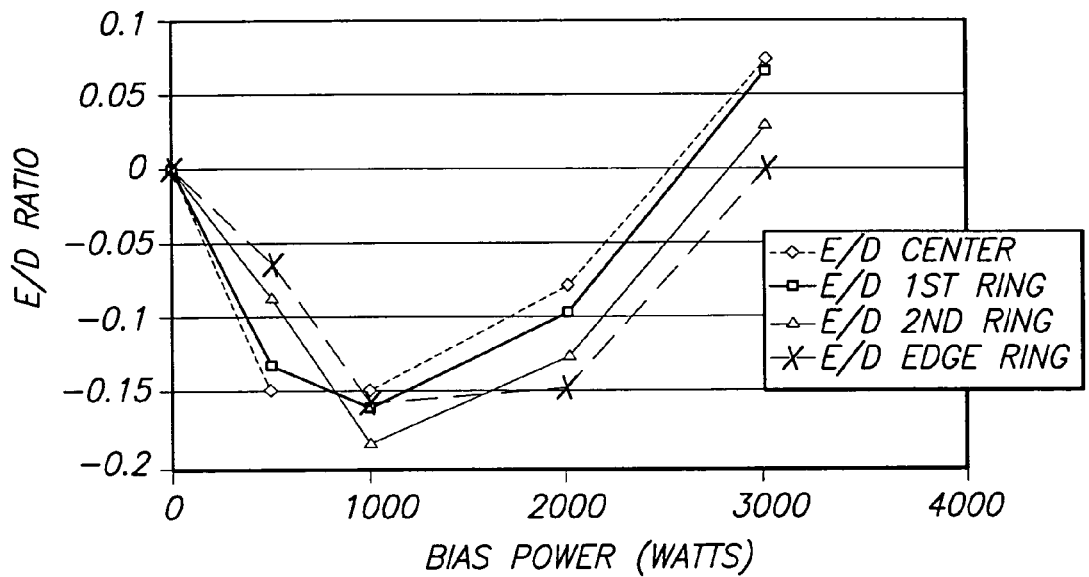
FIG. 4 is a graphical representation of an etch/deposition uniformity indicating measured etch/deposition ratios as a function of bias power for processes utilizing $H_2$.

This disclosure of the invention is submitted in furtherance of the constitutional purposes of the U.S. Patent Laws "to promote the progress of science and useful arts" (Article 1, Section 8).

The invention encompasses an improved method of depositing layers over a substrate. The layers can be deposited by chemical vapor deposition utilizing one or more heavy-hydrogen compounds. For purposes of the present description, the term heavy-hydrogen can refer to deuterium (D) or tritium (T), and the term heavy-hydrogen compound can refer to a compound having one, some or all hydrogen atoms replaced with D and/or T above the level of natural abundance for the corresponding heavy isotope. More specifically, silicon-comprising layers can be formed by high density plasma chemical vapor deposition (HDP-CVD) in the presence of a heavy-hydrogen sputtering gas, a heavy-hydrogen comprising precursor compound, or both a heavy-hydrogen precursor and a heavy-hydrogen sputtering gas.

HDP-CVD typically involves simultaneous chemical deposition and sputter-etch of a material being deposited. The simultaneous deposition and etch results in a net deposition rate which can also be referred to as an overall deposition rate. Methodology of the present invention can be utilized to provide an improved uniformity (decreased variance) of the net deposition rate across a surface. Aspects of the methodology of the invention can be particularly useful in gap-filled processes and can minimize or eliminate voids in the resulting filled gaps.

Methodology of the present invention is described with reference to FIGS. 1–9. Referring first to FIG. 1, a reactor 10 is illustrated which can be utilized for performing methods of the present invention. Reactor 10 can be, for example, a chemical vapor deposition reactor such as a HDP-CVD reactor. As depicted in FIG. 1, reactor 10 has a reaction chamber 12 and can comprise a dome 13 having one or more radio frequency (RF) coils 14. Reactor 10 can comprise one or more inlets 18 and can comprise one or more outlets 20. Inlets 18 can be, for example, gas injectors.

Reactor 10 can comprise a substrate platform 22 for holding or retaining a substrate 90. Where reactor 10 is a HDP reactor, substrate platform 22 can be an electrostatic chuck (ESC). For performing methodology of the present invention, reactor 10 can typically be an inductively coupled reactor although the invention contemplates utilization of a capacitively coupled reactor or an electron cyclotron resonance (ECR) reactor.

An exemplary inductively coupled HDP-CVD reactor that can be utilized in performing methodology of the present invention is the standard Novellus HDP chamber (SPEED®) of Novellus Systems, Inc. of San Jose, Calif. When utilizing such a reactor, low frequency (LF) power can be applied to dome coil 14 inducing an RF electric field within chamber 12. The RF electric field can be utilized to generate a high density plasma 16. For purposes of the present invention the term "high density plasma" refers to a plasma having a density of greater than or equal to about $10^{11}$ ions/cm$^3$. An RF bias can be applied to wafer 90 by application of high frequency (HF) power to electrostatic chuck 22 resulting in attraction of ionized plasma molecules from plasma 16 toward wafer 90 for sputtering.

To simplify the description which follows, conditions and parameters will be reported based upon utilization of the SPEED® HDP system. It is to be understood, however, that the invention encompasses utilization of alternative reactors for which the conditions and parameters could vary from those specifically described.

A particular aspect of the present invention is described with reference to FIGS. 1–4. Referring to FIG. 2, a semiconductor wafer or wafer fragment 90 is illustrated at a preliminary step of a method of the present invention. Wafer fragment 90 can comprise a semiconductive substrate 100. To aid in interpretation of the claims that follow, the terms "semiconductive substrate" and "semiconductor substrate" are defined to mean any construction comprising semiconductive material, including but not limited to, bulk semiconductive material such as a semiconductor wafer (either alone or in assemblies comprising other materials thereon) and semiconductive material layers (either alone or in assemblies comprising other materials). The term "substrate" refers to any supporting structure, including but not limited to, the semiconductor substrates described above. Substrate 100 can comprise a surface 102 which can be planar as shown in FIG. 2 or which can alternatively comprise one or more topographical features.

Referring to FIG. 3, a layer of material 104 can be deposited over surface 102 utilizing, for example, HDP-CVD in the presence of one or more heavy-hydrogen comprising compounds. Layer 104 can be formed, for example, within a high density plasma reaction chamber such as that shown in FIG. 1. The at least one compound comprising a heavy-hydrogen isotope substituent can be provided into reaction chamber 12 through one or more inlets 18. Layer 104, (FIG. 3) can comprise, for example, an insulative material such as silicon oxide, and in particular aspects can be silicon dioxide or doped silicon dioxide.

Conventional methods of forming oxide layer 14 utilizing HDP-CVD typically involve deposition utilizing a gas mixture which can comprise one or more precursor compounds, one or more inert gas such as, for example, argon (Ar) and in some instances an oxidant gas comprising one or more of $O_2$, $O_3$ and $NO_3$. During HDP deposition, some of the gas mixture can be involved in sputtering of the deposited material and can be referred to as a sputtering component of the mixture. In some instances, conventional methods replace some or the entire inert gas component with, for example, $H_2$ or He which can affect the sputtering of the deposited material. However, the rate of deposition of can vary across a surface utilizing $H_2$ in HDP-CVD systems, resulting in unpredictability and non-uniform deposition.

Exemplary precursor compounds utilized in conventional silicon oxide deposition processes include silane ($SiH_4$), disilane ($Si_2H_6$), dichloro-silane $SiCl_2H_2$, and $Si(OC_2H_5)_4$ ("TEOS"). Conventional formation of doped oxide layers can comprise deposition in the presence of one or more of phosphine ($PH_3$), diborane ($B_2H_6$), arsine ($AsH_4$), trimethyl phosphate ($C_3H_9O_3P_3$), and trimethyl borate ($C_3H_9O_3B_3$).

Methodology of the present invention includes utilization of one or more of a deuterated and/or tritiated precursor compound, a deuterated and/or tritiated dopant compound, a heavy diatomic hydrogen gas, or a combination of any of these. For purposes of the present invention, heavy diatomic hydrogen gas or heavy-hydrogen gas can refer to DH, DT, $D_2$, $T_2$, TH, and mixtures thereof.

In particular aspects, methodology of the present invention can comprise providing one or more precursor molecules, an oxygen-comprising gas and a deuterated and/or tritiated form of hydrogen gas into reaction chamber 12 (FIG. 1). High density plasma 16 can be generated within reaction chamber 12 for chemical vapor depositing of layer 104 over substrate 90. The deposition of layer 104 can comprise an overall (net) deposition rate which will be dependent upon the rate of deposition that would occur in the absence of simultaneous etching (i.e. in the absence of bias power) and the rate of simultaneous etch that occurs at the particular bias power utilized. The net deposition rate can be influenced by factors such as bias power, flow rates, pressures, temperatures and other parameters. Accordingly, the net rate of deposition can be changed or adjusting during the deposition of layer 104 by varying one or more parameters during the deposition.

It can be advantageous to replace some or all of $H_2$ or other sputtering gas component provided to chamber 12 (FIG. 1) to enhance uniformity in the overall deposition rate across the surface of substrate 90. In other words, the presence of a deuterium sputtering agent can decrease the degree of net deposition rate variance across surface 102 during HDP-CVD deposition of layer 104 (FIG. 3) relative to the corresponding degree of rate variance that occurs utilizing, for example, $H_2$ under otherwise identical conditions.

Figure 5:
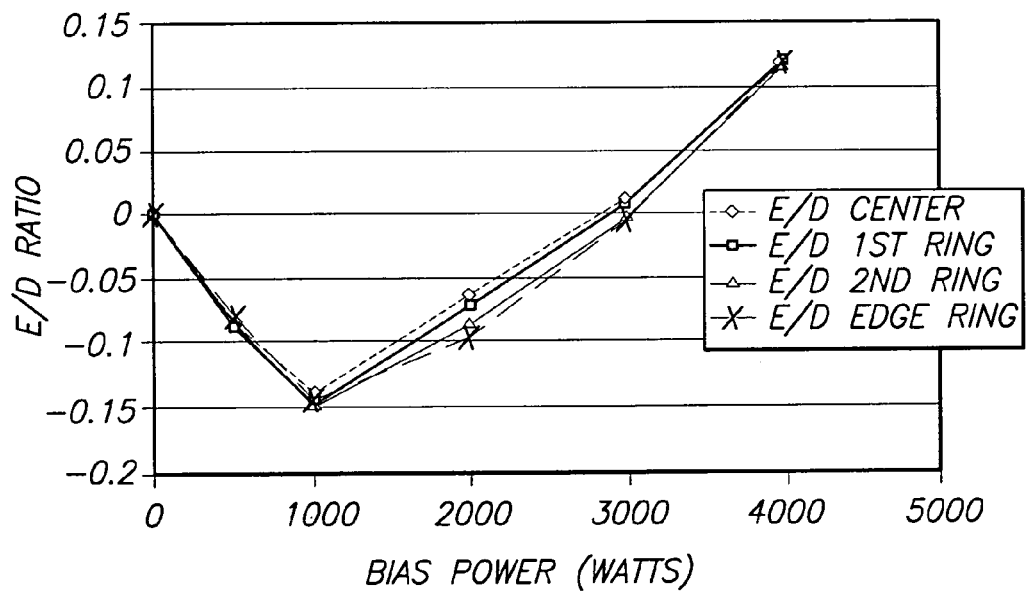
FIG. 5 is a graphical illustration of etch/deposition uniformity indicating measured etch/deposition ratios as a function of bias power in processes utilizing $D_2$ according to one aspect of the present invention.

FIGS. 4 and 5 illustrate the improved net deposition uniformity that can occur when $D_2$ (FIG. 5) is substitute for $H_2$ (FIG. 4) during silicon dioxide deposition utilizing HDP-CVD. The data presented in FIGS. 4 and 5 were obtained for HDP-CVD in a Novellus SPEED® reactor utilizing a 200 mm wafer 90 (FIG. 3) having a planar surface 102 onto which silicon dioxide layer 104 was deposited. The measured etch-to-depth ratio (E/D ratio) is indicated in each of FIGS. 4 and 5 for center point 108 on wafer 90 (FIG. 3), an edge ring of wafer 90 represented by point 110, a first ring located a first distance from center point 108 represented by point 112, and a second ring located a second distance from center point 108 represented as point 114.

Comparison of FIGS. 4 and 5 indicates a measurably improved etch/deposition uniformity obtained when $D_2$ is utilized in place of $H_2$ during HDP-CVD formation of an oxide layer. As shown in FIGS. 4 and 5, both $H_2$ and $D_2$ contribute to the deposition portion of the E/D ratio at low bias power resulting in enhanced net deposition and accounting for the negative E/D ratios. However $D_2$ improves the overall etch/deposition uniformity even at these low bias powers. Utilization of deuterium sputtering component can allow decreased variance in net deposition rate across the entire planar surface of wafer 90 relative to other sputtering components resulting in a substantially uniform layer thickness for all points across the planar wafer. The described invention can confer improved deposition uniformity and/or layer thickness uniformity by decreasing net deposition rate variance across a surface by 18% or higher relative to conventional non-heavy-hydrogen methodologies.

Referring again to FIG. 3, exemplary materials for layer 104 can comprise silicon oxide, silicon dioxide, phosphorous-doped silicon dioxide (PSG), boron-doped silicon oxide (BSG), boron phosphorous-doped silicon oxide (BPSG) or an oxide doped with an alternative dopant such as F, As Ge or combinations thereof. In embodiments of the invention where layer 104 is a doped oxide layer, heavy-hydrogen (D or T) can be contributed to plasma 16 shown in FIG. 1 by providing one or more deuterated or tritiated dopants such as $PH_{3-x}R_x$, $B_2H_{6-y}R_y$, $AsH_{4-q}$, $C_3H_{9-z}R_zO_3P_3$, and $C_3H_{9-z}R_zO_3B_3$; where R is T, D, or a combination thereof; and where x=1–3, y=1–6, z=1–9, and q=1–4. In particular applications, one or more deuterated and/or tritiated dopant compounds can be provided in conjunction with one or more of the diatomic heavy-hydrogen gases discussed above.

HDP-CVD deposition of layer 104 according to methodologies of the present invention can utilize providing one or both of deuterium and tritium within the high density plasma by providing one or more deuterated and/or tritiated precursor compound. Such heavy-hydrogen comprising precursor can comprise one or more of $SiR_xH_{4-x}$, $Si_2R_yH_{6-y}$, $SiCl_2RH$, $SiCl_2R_2$, $SiCl_2R_2$, $SiO_4C_8R_qH_{20-q}$, wherein R is deuterium, tritium, or a combination thereof, and wherein x=1–4, y=1–6, and q=1–20. The one or more heavy-hydrogen comprising precursor can be utilized individually or in conjunction with providing deuterated and/or tritiated sputtering gas within plasma 16 and/or one or more deuterated and/or tritiated dopants as described above.

As shown in FIG. 3, deposition of layer 104 onto planar surface 102 by HDP-CVD in the presence of deuterium and/or tritium in the high density plasma can be utilized to produce layer 104 to have a substantially planar surface 106 due to the improved net deposition rate uniformity afforded by the presence of heavy-hydrogen relative to hydrogen. Methodology of the present invention can also be advantageously utilized in forming a layer over a non-planar surface, over a surface having a rugged topography, over substrates having one or more depressions, openings or trenches, over substrates having one or more elements over a substrate surface, or various combinations thereof.

An exemplary application where the methodology of the present invention can be particularly advantageous is for purposes of filling gaps. Providing deuterium and or tritium during HDP-CVD can advantageously fill depressions, openings and/or gaps to provide a filled area having fewer voids and/or less void area than would occur if hydrogen were utilized in place of the heavy-hydrogen. The methodology of the invention can produce a gap-fill that is essentially void-free, where the term "void-free" refers to a filled area which has an absence of detectable void area therein.

Figure 6:
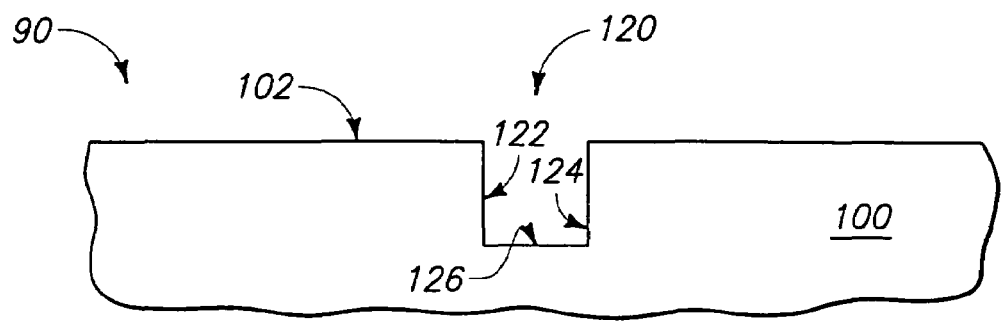
FIG. 6 is a diagrammatic cross-sectional view of a substrate wafer fragment at a preliminary step of an embodied method of the present invention.

An exemplary application of the methodology of the present invention is described with reference to FIGS. 6 and 7. Referring to FIG. 6, a wafer or wafer fragment 90 comprising substrate material 100 having a gap or opening 120 therein is provided. Opening 120 can be described as a gap-feature or a gap-structure and can be, for example, an isolation region such as a trench isolation region. Opening 120 can be formed utilizing conventional processing methods.

Opening 120 can be described as having a bottom surface 126 and having opening sidewalls 122 and 124. As shown in FIG. 6, opening 120 can have sidewalls 122 and 124 that are substantially perpendicular to planar bottom surface 126. Opening 120 can further be described as having an aspect ratio defined by the height of the opening relative to the width of the opening or, in the case of the specific example shown in FIG. 6, the aspect ratio can be the length of sidewall 122, 124 relative to the length of base surface 126. Alternatively, opening 120 can have a non-planar base surface, can have a non-rectangular shape, and/or can comprise sidewalls that are not substantially perpendicular to the base surface (not shown).

Figure 7:
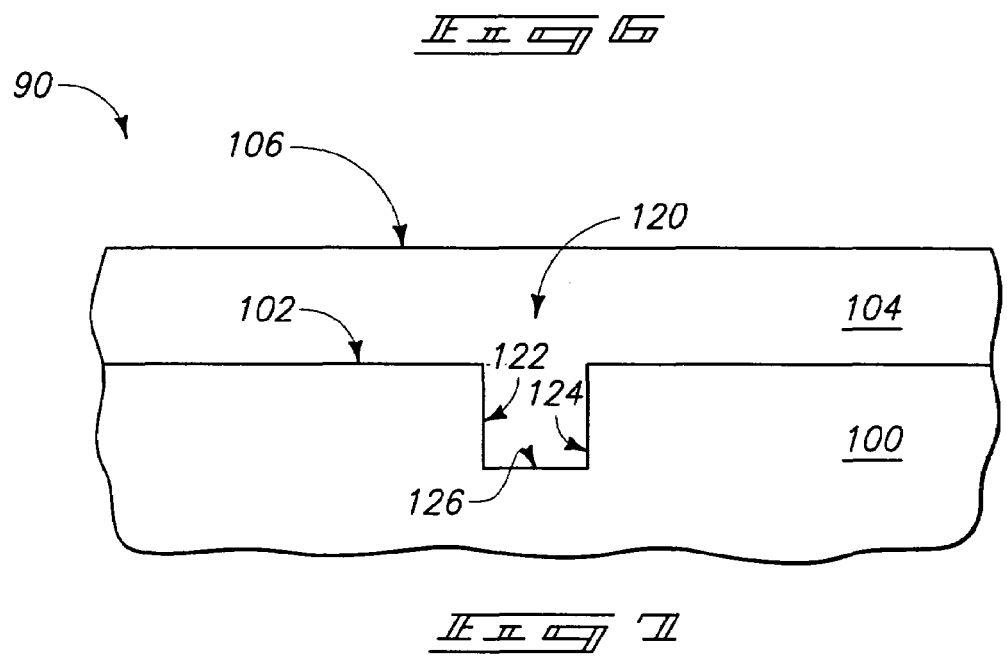
FIG. 7 is a view of the FIG. 6 wafer fragment shown at a processing step subsequent to that of FIG. 6.

Referring to FIG. 7, a layer of material 104 can be deposited over substrate 100 and over surface 102 to fill opening 120. Alternatively, formation of gap-fill 104 can be performed such that a net deposition of material 104 occurs within opening 120 without substantial net deposition over surface 102 (not shown). Deposition of material 104 can comprise HDP-CVD utilizing high density plasma having a sputtering component comprising deuterium and/or tritium. In particular applications, deuterium and/or tritium can be provided to the sputtering component of the high density plasma by providing $D_2$, $T_2$, or any diatomic combination of H, T, and D as discussed above.

Methodologies of the present invention also encompass formation of layer 104 utilizing any of the deuterated or tritiated precursor compounds discussed above. Such precursors can be utilized individually, can be combined with other precursors and can also be combined with providing heavy-hydrogen gas. In applications where layer 104 comprises a doped material such as a doped oxide, a deuterated and/or tritiated dopant can be provided in the high density plasma. Appropriate tritiated and/or deuterated dopants for formation of layer 104 are as described above.

Utilization of one or more deuterated and/or tritiated compounds for high density plasma deposition of layer 104 in gap-fill applications can provide improved gap-fill properties relative to conventional gap-fill technologies. Utilizing methodology of the present invention, opening 120 can be filled to contain fewer voids and/or a decreased area of voids relative to methods utilizing only non-deuterated compounds under otherwise substantially identical deposition conditions, with the term "substantially identical" meaning identical within tolerances of process control. The methodology of the invention can therefore be particularly useful for high aspect ratio (greater than about 3:1), or very-high aspect ratio (greater than about 5:1) gap fill applications. Gaps having aspect ratios as high as about 8:1 can be filled essentially void-free utilizing the present methodology. Additionally, the methodology can be particularly useful for filling openings having submicron widths. Openings having widths as narrow a few nanometers can be effectively filled to be essentially free of voids utilizing methodology of the invention. It is to be understood, however, that the invention also contemplates utilizing the described methodology to fill depressions and low aspect ratio openings.

Figure 8:
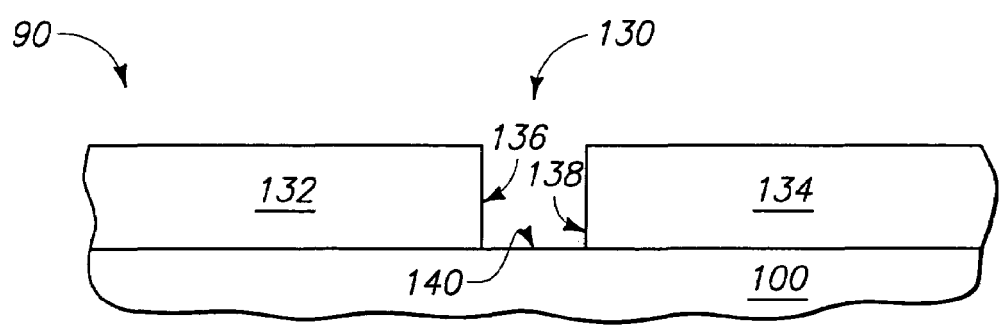
FIG. 8 is a diagrammatic cross-sectional view of a substrate wafer fragment at a preliminary step of a method according to one aspect of the present invention.

Another application utilizing methodology of the present invention is described with reference to FIGS. 8–9. Referring to FIG. 8, a wafer fragment 90 can be provided having an opening 130 between elements 132 and 134 over substrate 100. Opening 130 can be described as a gap-feature or gap structure. Elements 132 and 134 are not limited to any particular structural feature and can be, for example, conductive lines. Elements 132 and 134 can be formed using conventional processing methods. Openings 130 can comprise a bottom surface 140 and sidewalls 136, 138, and can comprise an aspect ratio having values as indicated above with reference to opening 120 (FIG. 6).

Figure 9:
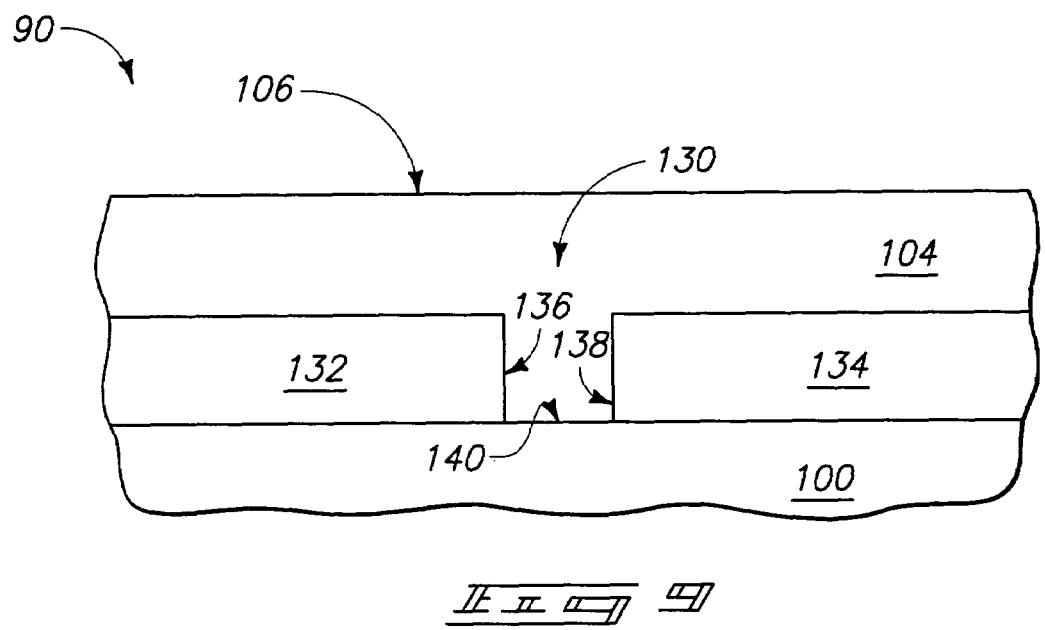
FIG. 9 is a view of the FIG. 8 wafer fragment shown at a processing step subsequent to that of FIG. 8.

As shown in FIG. 9, a layer of material 104 can be deposited over substrate 100 to substantially fill opening 130. As will be recognized by those of ordinary skill in the art, in particular applications layer 104 can be formed to have a substantially planar surface 106 by appropriately adjusting bias power across the wafer during HDP-CVD. Utilizing methodology of the present invention, material 104 can be deposited to essentially fill gap 130 to be substantially void-free by providing one or more of deuterium and/or tritium in the high density plasma during CVD. Deuterium and/or tritium can be provided within the high density plasma utilizing any of the heavy-hydrogen precursors, heavy-hydrogen dopants, heavy diatomic hydrogen compounds, or mixtures thereof described above.

Where a Novellus SPEED® HDP-CVD reactor is utilized in performing methodologies of the present invention, appropriate deposition conditions can include providing diatomic hydrogen and/or heavy-hydrogen forms thereof at from about 100 standard cubic centimeters per minute (sccm) to about 2000 sccm. An oxygen-comprising component comprising $O_2$ and/or $O_3$ can be provided within the reactor at from about 200 sccm to about 20 sccm. One or more precursor compounds or heavy-hydrogen substituted precursor compounds can be provided at a total of from about 100 sccm to about 10 sccm. An appropriate deposition temperature can be from about 400° C. to about 800° C. at a pressure of from about 2 mTorr to about 50 mTorr.

It is to be understood that the invention encompasses utilization of an alternative inductive reactor, an ECR reactor, or a capacitive reactor. Utilization of such alternative reactors can comprise utilization of alternative conditions and parameters based upon the individual reactor and the specific compounds utilized during the deposition.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of depositing a layer over a substrate, comprising:
    providing a substrate within a high density plasma reaction chamber;
    providing heavy-diatomic hydrogen gas within the reaction chamber;
    providing at least one compound having a heavy-hydrogen isotope substituent into the reaction chamber;
    generating a high density plasma within the reaction chamber; and
    chemical vapor depositing a layer over the substrate, the layer incorporating at least a portion of the at least one compound.

2. The method of claim 1 wherein the heavy-hydrogen isotope is deuterium.

3. The method of claim 1 wherein the at least one compound is selected from the group consisting of $SiD_xH_{4-x}$, $Si_2D_yH_{6-y}$, $PD_zH_{3-z}$, $SiCl_2DH$, and $SiCl_2D_2$, $SiO_4C_8D_qH_{20-q}$, where x=1–4, y=1–6, z=1–3 and q=1–20.

4. The method of claim 1 wherein the layer comprises an oxide material.

5. The method of claim 1 wherein the layer is simultaneously deposited and etched during the depositing.

6. The method of claim 1 wherein the depositing produces a substantially planar surface.

7. The method of claim 1 wherein the at least one compound is comprised by a mixture, the mixture further comprising at least one of $O_2$ and $O_3$.

* * * * *

UNITED STATES PATENT AND TRADEMARK OFFICE
CERTIFICATE OF CORRECTION

PATENT NO. : 7,056,833 B2 Page 1 of 1
APPLICATION NO. : 10/669671
DATED : June 6, 2006
INVENTOR(S) : Rueger et al.

It is certified that error appears in the above-identified patent and that said Letters Patent is hereby corrected as shown below:

Column 1, Line 64 – Replace "DT; $T_2$" with --DT, $T_2$--.

Column 4, Line 1 – replace "oxide layer 14" with --oxide layer 104--.

Column 4, Line 12 – Replace "deposition of can" with --deposition can--.

Column 4, Line 44 – Replace "changed or adjusting" with --changed or adjusted--.

Column 4, Line 58 – Replace "is substitute for" with --is substituted for--.

Column 5, Line 25 – Replace "F, As Ge" with --F, As, Ge--.

Column 5, Line 42 – Delete "$SiCl_2R_2$," after "$SiCl_2R_2$,".

Column 6, Line 65 – Replace "narrow a few" with --narrow as a few--.

Signed and Sealed this

Twenty-fourth Day of April, 2007

JON W. DUDAS
*Director of the United States Patent and Trademark Office*